(12) United States Patent
Brinkmann et al.

(10) Patent No.: US 10,761,402 B2
(45) Date of Patent: Sep. 1, 2020

(54) GENERATION OF OUTPUT LASER PULSES HAVING A TUNABLE CENTRAL WAVELENGTH

(71) Applicant: Refined Laser Systems GmbH, Münster (DE)

(72) Inventors: Maximilian Brinkmann, Münster (DE); Carsten Fallnich, Lehrte (DE); Tim Hellwig, Münster (DE)

(73) Assignee: Refined Laser Systems GmbH, Münster (DE)

( * ) Notice: Subject to any disclaimer, the term of this patent is extended or adjusted under 35 U.S.C. 154(b) by 0 days.

(21) Appl. No.: 16/461,102

(22) PCT Filed: Nov. 15, 2017

(86) PCT No.: PCT/EP2017/079363
§ 371 (c)(1),
(2) Date: May 15, 2019

(87) PCT Pub. No.: WO2018/091552
PCT Pub. Date: May 24, 2018

(65) Prior Publication Data
US 2020/0064710 A1    Feb. 27, 2020

(30) Foreign Application Priority Data
Nov. 16, 2016   (DE) .................. 10 2016 122 047

(51) Int. Cl.
*G02F 1/39* (2006.01)
*G02F 1/35* (2006.01)
*H01S 5/00* (2006.01)

(52) U.S. Cl.
CPC .............. *G02F 1/395* (2013.01); *G02F 1/353* (2013.01); *H01S 5/0092* (2013.01);
(Continued)

(58) Field of Classification Search
CPC .... G02F 1/353; G02F 1/395; G02F 2001/392; G02F 2001/3542; G02F 2201/02;
(Continued)

(56) References Cited

U.S. PATENT DOCUMENTS 7,630,418 B2 * 12/2009 Franjic ................ B23K 26/38
372/21
2010/0321767 A1 * 12/2010 Borguet ................ G02F 1/3544
359/330
(Continued)

FOREIGN PATENT DOCUMENTS

DE    102017129637 A1 *  6/2019  ............... G02F 1/39

OTHER PUBLICATIONS

Maximilian Brinkmann et al: "Electronically and rapidly tunable fiber-integrable optical parametric oscillator for nonlinear microscopy", Optics Letters, Bd. 41, Nr. 10, 15. May 2016 (May 15, 2016), Seite 2193, XP055448702, ISSN: 0146-9592, DOI: 10.1364/OL.41.002193; 4 pages.
(Continued)

*Primary Examiner* — Daniel Petkovsek
(74) *Attorney, Agent, or Firm* — Harness, Dickey & Pierce, P.L.C.

(57) ABSTRACT

In a device for generating output laser pulses having a tunable central wavelength, based on parametric amplification, a laser system is to be provided that has less complexity, but that nevertheless provides great tunability for the wavelength, permits rapid switching of the wavelength, and allows the spectral bandwidth of the emitted pulses to be adjusted. This is attained in that for adjustability of the bandwidth of the output laser pulses, an optical device is provided that is designed to influence the spectral phase of the pump pulses as a function of the spectral phase of the seed pulses.

16 Claims, 3 Drawing Sheets

Figure 1:
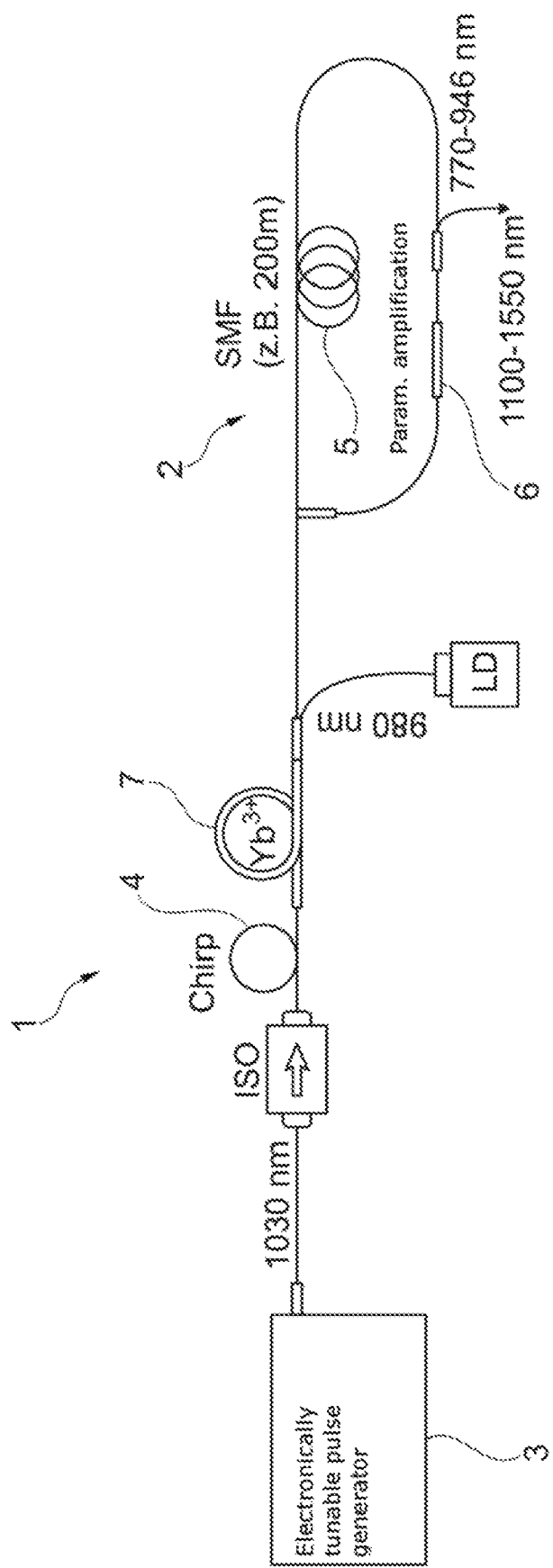

(52) U.S. Cl.
CPC ............... *G02F 2001/3542* (2013.01); *G02F 2001/392* (2013.01); *G02F 2203/15* (2013.01)

(58) Field of Classification Search
CPC .. G02F 2203/15; H01S 3/0057; H01S 3/0675; H01S 3/06754; H01S 5/0092; H01S 5/06216; H01S 5/06246
See application file for complete search history.

(56) References Cited

U.S. PATENT DOCUMENTS

2011/0273763 A1* 11/2011 Kaertner .................. G02F 1/39
359/330
2015/0015938 A1 1/2015 Kieu et al.

OTHER PUBLICATIONS

Forget Net Al: "Wideband to Narrowband Pulse Shaping via a Chirp-Transform Scaling Technique", CLEO '07. 2007 Conference on Lasers and Electro-Optics May 5-11, 2007 Baltimore, MD, USA, OSA, Piscataway, NJ, USA, May 6, 2007 (May 6, 2007), Seiten 1-2, XP031231905, ISBN: 978-1-55752-834-6; 2 pages.

Fan G et al: "High power top-hat pulses for efficient OPA pumping", 2013 Conference on Lasers & Electro-Optics Europe & International Quantum Electronics Conference CLEO Europe/IQEC, IEEE, May 12, 2013 (May 12, 2013), Seite 1, XP032589236, DOI: 10.1109/CLEOE-IQEC.2013.6801059 [gefunden am Apr. 17, 2014]; 1 page.

International Search Report and Written Opinion regarding PCT/EP2017/079363 (in English and German); dated Feb. 21, 2018; 22 pages.

* cited by examiner

GENERATION OF OUTPUT LASER PULSES HAVING A TUNABLE CENTRAL WAVELENGTH

CROSS-REFERENCE TO RELATED APPLICATIONS

This application is a National Stage of International Application No. PCT/EP2017/079363 filed on Nov. 15, 2017. This application claims the priority to German Patent Application No. 10 2016 122 047.7, filed on Nov. 16, 2016. The entire disclosures of the above applications are incorporated herein by reference.

FIELD

The present disclosure relates to a device and a method for generating output laser pulses having a tunable central wavelength and adjustable bandwidth, based on a parametric amplification.

BACKGROUND

This section provides background information related to the present disclosure which is not necessarily prior art.

For many applications in spectroscopy, e.g. for process monitoring, microscopy, or microspectroscopy, rapidly (<1 ms) and distantly (>2000 cm$^{-1}$) tunable coherent light sources, hereinafter referred to as laser systems, are desired. These laser systems should either have spectrally particularly narrow-band pulses for high resolution (<0.3 THz or 10 cm$^{-1}$), and thus temporally long pulses (>1.5 ps), or they should have particularly short pulses (<500 fs) with a broad spectral bandwidth (>0.8 THz) for a high peak output. In addition, the construction of these laser systems should be as robust as possible. Following the construction of a laser system, there should be no degrees of freedom for adjustment, such as using adjustable mirrors, so that operation by the user is possible without any adjustment required. In addition, this should prevent maladjustment due to environmental influences. These laser systems should be able to be used routinely in a wide variety of industrial and clinical settings without it being necessary to have special expertise with lasers.

Normally a combination of a pump laser and an optical parametric oscillator (OPO) or amplifier (OPA) is used to generate ultrashort light pulses having an adjustable wavelength. According to the current state of the art, as a rule the pump laser for the OPO or OPA is based on a mode-coupled laser oscillator that generates ultrashort laser pulses at a fixed or tunable wavelength. In an OPO, parametric generation converts a pump pulse to two wavelength-shifted pulses, specifically a signal pulse and an idler pulse. One of the two pulses (idler pulse or signal pulse) is fed back via a resonator, so that it then acts as a seed pulse for parametric amplification. Since parametric amplification is an energy-conserving process, at the same time the non-resonant signal pulse/idler pulse is further amplified, so that this pulse may be decoupled as output signal of the laser system. The decoupled pulse shall be referred to hereinafter as the output pulse.

If wavelength-tunable, ultrashort pulses having a duration of less than 500 fs (broad spectrum) are to be generated, these laser systems are always constructed using the free beam technique and are frequently based, e.g., on titan-sapphire lasers. If ultrashort pulses having a duration in the picosecond range (narrow-band spectrum) are to be generated, the laser systems used are either also based on free beam technique or, more recently, nearly completely on optical fibers, e.g. fiber optical parametric oscillators (FOPO). However, these new, largely tunable FOPOs also require a free beam portion, even if it is just a small free beam portion, that requires adjustment and represents a weakness for maintenance-free operation.

Coherent laser systems having free beam regions are generally more complex than completely glass fiber-based systems. In addition, the adjusting, stabilization of the adjustment, and mechanical stability requirements for the device housing mean much greater complexity. However, robust, maintenance-free laser systems comprising glass fiber components completely welded thereto are desired for broad distribution and use of such laser systems.

Another disadvantage in the prior art is that changing from the emission of picosecond pulses to femtosecond pulses is not possible in any of the laser systems available in the past or is only possible with significant modifications to the laser system. A simple change from femtosecond operation to picosecond operation, e.g. by exchanging individual modules, which would also entail significant advantages for production and use of such laser systems, has not been possible in the past. In addition, there is the drawback in the FOPOs known from the prior art that the selection of the wavelength of the emitted laser radiation in most of the concepts is limited solely to mechanical or thermal tuning mechanisms due to limitations in the pump laser. However, due to mass inertia or temperature inertia, these mechanisms are slow in principle (>1 ms per wavelength step) and therefore moreover permit only continuous tuning of the wavelength. Generating a rapidly changing (<100 µs) sequence of pulses with freely selectable wavelengths, which is desired for applications, e.g. in spectroscopy, or for pump-sample experiments, may thus be realized only with difficulty or not at all.

FOPOs that are based entirely on fiber optics and that may be tuned electronically using the selection of the repetition rate for the pump laser are free of the drawbacks cited above. The FOPOs known from the prior art are limited, however, with respect to free configuration of the spectral bandwidths of the emitted pulses. In the past, in particular it has not been possible to generate impulses with very wide spectra, that is, temporally very short pulses, due to a low amplification bandwidth for the amplification media and fiber-induced dispersion effects. For example, to date it has only be possible to generate pulses having a duration of <500 fs in laser systems that used a glass fiber as amplifying medium, but that apart from this were constructed to prevent additional dispersion completely in free beam optics. Moreover, changing from femtosecond operation to picosecond operation is not possible or is only possible with significant modifications to the laser system.

SUMMARY

This section provides a general summary of the disclosure, and is not a comprehensive disclosure of its full scope or all of its features.

The underlying object of the disclosure is therefore to provide a laser system that is less complex but that nevertheless provides great tunability for the wavelength, permits rapid switching of the wavelength, and allows the spectral bandwidth of the emitted pulses to be adjusted.

In a device for generating output laser pulses having a tunable central wavelength, based on parametric amplification of the type described in the foregoing, this object is attained according to the disclosure in that, for adjustability of the bandwidth of the output laser pulses, an optical device is provided that is designed to influence the spectral phase of the pump pulses as a function of the phase of the seed pulses.

In contrast to the laser systems known from the prior art, which are based on complex laser oscillators as pump laser for OPOs, the present laser system is preferably based on an electronically controllable pulse generator. Because of this it becomes possible to adjust the output wavelength of the FOPOs very rapidly (<100 µs) via the electronically selectable repetition rate in combination with resultant dispersion filtering in the FOPO. Due to this purely electronic tuning mechanism, the laser system is able to do entirely without free beam techniques and the tuning mechanism permits both continuous and discrete abrupt changes in the wavelength. This thus permits generation of a rapidly changing sequence of pulses with freely selectable wavelengths.

The spectral phase of the pump pulses following the generation of the pump pulse is adapted to the dispersion occurring in the FOPO for controlling the spectral bandwidth of the signal pulses generated in the FOPO. Influencing the spectral phase results in a temporal change in the instantaneous frequency within an optical pulse. Thus influencing of a resonant seed pulse (modulated in the spectra phase), which has been chirped by the dispersion of the FOPO, with a suitable chirped pump pulse is essential. Since during parametric amplification the instantaneous frequency of the generated signal pulses are at any time directly dependent on the instantaneous seed frequency through the spectral distance of the instantaneous pump frequency, the resulting spectrum of the laser systems may thus be controlled precisely.

In one preferred embodiment, the spectral phase of the pump pulses is influenced such that in the Wigner chart the pump pulse follows a line that has precisely half the incline of the corresponding line of the chirped seed pulses in the Wigner chart (for Gaussian pulses therefore the so-called chirp parameter $C_1$ of the pump pulses is approximately half as large as the chirp parameter $C_2$ of the seed pulses: $C_1=0.5*sqrt[C_2^2-3]$). This embodiment permits generation of particularly narrow-band output pulses. In another preferred embodiment, the chirped pump pulses in the Wigner chart follow a line with an operator reversed from the incline of the corresponding line of the chirped seed pulses and thus permit generation of particularly broad-band output pulses. The central advantage of these embodiments is thus the combination of the rapid electronic selectability of the repetition rate for the pump pulses for tuning the wavelength of the FOPOs with control of the spectral content of the generated pulses and the large range of wavelength tunability.

In one embodiment of the disclosure, the optical device is designed to influence the spectral phase of the pump pulses following pulse generation. Influencing the spectral phase following pump pulse generation has the advantage that the optical device for such influencing may be changed rapidly and is independent of the pulse generator used.

In one embodiment of the disclosure, the optical device for influencing the spectral phase of the pump pulses is preferably arranged in the optical path between pump pulse generator and fiber-based optical parametric oscillator.

In one embodiment of the disclosure, the optical device for influencing the spectral phase of the pump pulses is embodied as passive or active glass fibers in the linear or non-linear regime. Glass fibers may be used to influence the spectral phase in a targeted manner. In the linear regime, the already existing frequency portions are temporally reordered, while in the non-linear regime, due to the self-phase modulation, broadening of the spectrum is also attained, the laser pulse thus also obtaining additional frequency components.

Moreover, in one embodiment of the disclosure, the optical device for influencing the spectral phase of the pump pulses is embodied as a chirped fiber Bragg grating or long-periodic grating. Fiber Bragg gratings are used, inter alia, for compensating chromatic dispersion, e.g. in telecommunications. In one embodiment of the disclosure, they may also be used for influencing the spectral phase of the pump pulses.

In another embodiment of the disclosure, the optical device for influencing the spectral phase of the pump pulses is embodied as an active component. Active optical components have the advantage that by using them it is possible to vary the optical properties in a flexible manner.

In one preferred embodiment, the active component is an acoustooptical programmable dispersive filter. In addition to variability, the advantage of the acoustooptical, programmable dispersive filter is found in the ability to be able to influence many dispersion arrangements independently.

In another embodiment of the disclosure, the device is designed to influence the spectral phase of the pump pulses as early as during pulse generation.

In one preferred embodiment of the disclosure, the optical pump pulse generator is embodied as a gain switched laser diode, wherein in another preferred embodiment, optical injection synchronization of the laser diode is provided in addition to the gain switched laser diode.

In one embodiment, the optical pump pulse generator is embodied as a continuously emitting laser diode and the pump pulses are formed by subsequent modulation.

In another preferred embodiment, amplitude modulation is provided by means of electrooptical modulators.

In one embodiment, at least one optical amplifying stage is provided in the optical path between pump pulse generator and fiber-based optical parametric oscillator. For power scaling the pump radiation it is advantageous to use one or a plurality of optical amplifying stages. These may be ytterbium glass fiber amplifiers, for example.

The parametric amplifying medium preferably has a spectrally broad amplifying range. A broad effective amplifying spectrum has the advantage that the amplifying range comprises the entire output wavelength range at any time and thus rapid switching of the output wavelength is enabled. Thus it is possible to do without complicated adaptation to the desired output wavelength, for instance by adapting the phase adaptation condition using change in temperature.

In one preferred embodiment, the parametric amplifying medium of the fiber-based optical parametric oscillator has a waveguide dispersion that is designed as a function of the length of the waveguide. The parametric amplification curve is primarily determined by the dispersion of the waveguide, wherein it is possible to attain a broad effective amplifying spectrum by influencing dispersion.

The change in the waveguide dispersion along the dispersion direction of the light is advantageously provided by a change in the waveguide geometry along the dispersion direction of the light. In one preferred embodiment, a broad effective amplifying spectrum is attained by varying the fiber diameter, and thus the waveguide dispersion in the amplifier, along the dispersion direction of the light. This may preferably be attained by tapering the glass fiber using heat and tensile forces (tapering) prior to installation in the FOPO.

In one advantageous embodiment of the disclosure, the change in the waveguide geometry is accomplished using two or more different but constant cross-sections of the waveguide along the dispersion direction of the light.

In another advantageous embodiment of the disclosure, the change in the waveguide geometry is accomplished using a continuous change in the cross-section along the dispersion direction of the light.

In one embodiment of the disclosure, the parametric amplification is provided by means of photonic crystal fibers.

In another embodiment of the disclosure, the parametric amplification is provided by means of integrated, parametric optical amplifying chips.

Finally, the disclosure is also distinguished by a method for generating output laser pulses having a tunable central wavelength, based on parametric amplification, in which method pump pulses are generated at an adjustable repetition rate, the pump pulses are received in a fiber-based optical parametric oscillator with a parametric amplifying medium, the pump pulses are converted using parametric generation to a wavelength-shifted idler pulse and a signal pulse wavelength-shifted thereto, in which method the idler pulses or the signal pulses are fed back via a dispersive resonator, in which method the fed-back idler pulses and signal pulses are then used as seed pulses for parametric amplification, and in which method the spectral phase of the pump pulses is influenced as a function of the phase of the seed pulses by means of an optical device.

The aforesaid and claimed components that are to be used according to the disclosure and are described in the exemplary embodiments are not subject to special conditions with respect to their size, shape, configuration, material selection, or technical concepts, so that the selection criteria known in the field of application may be used with no restrictions.

DRAWINGS

Further details, features, and advantages of the subject matter of the disclosure result from the subordinate claims and from the description in the following of the associated drawings, in which preferred embodiments of the disclosure are provided as examples.

Figure 2:
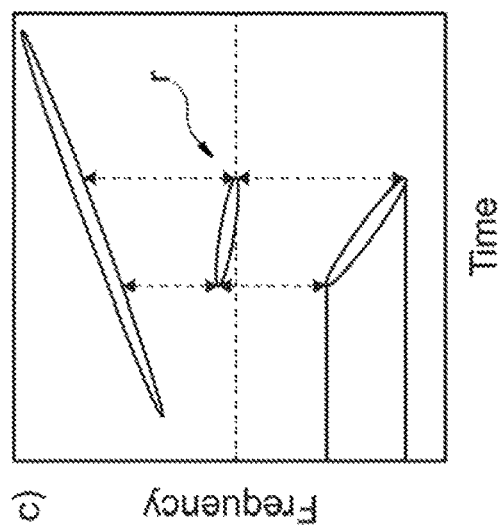
Figure 2:
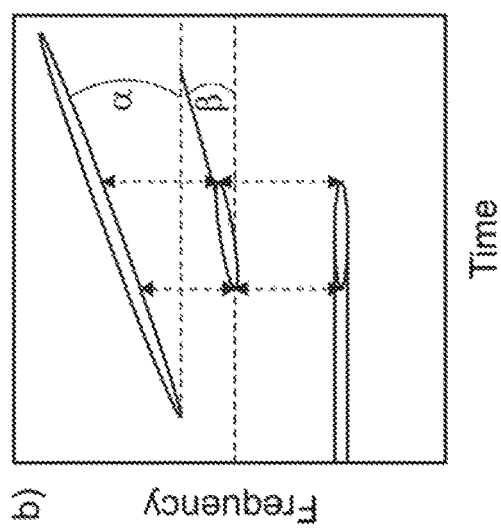
Figure 2:
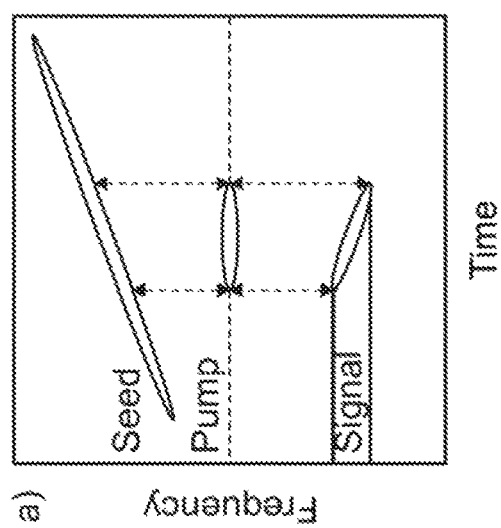
Figure 3:
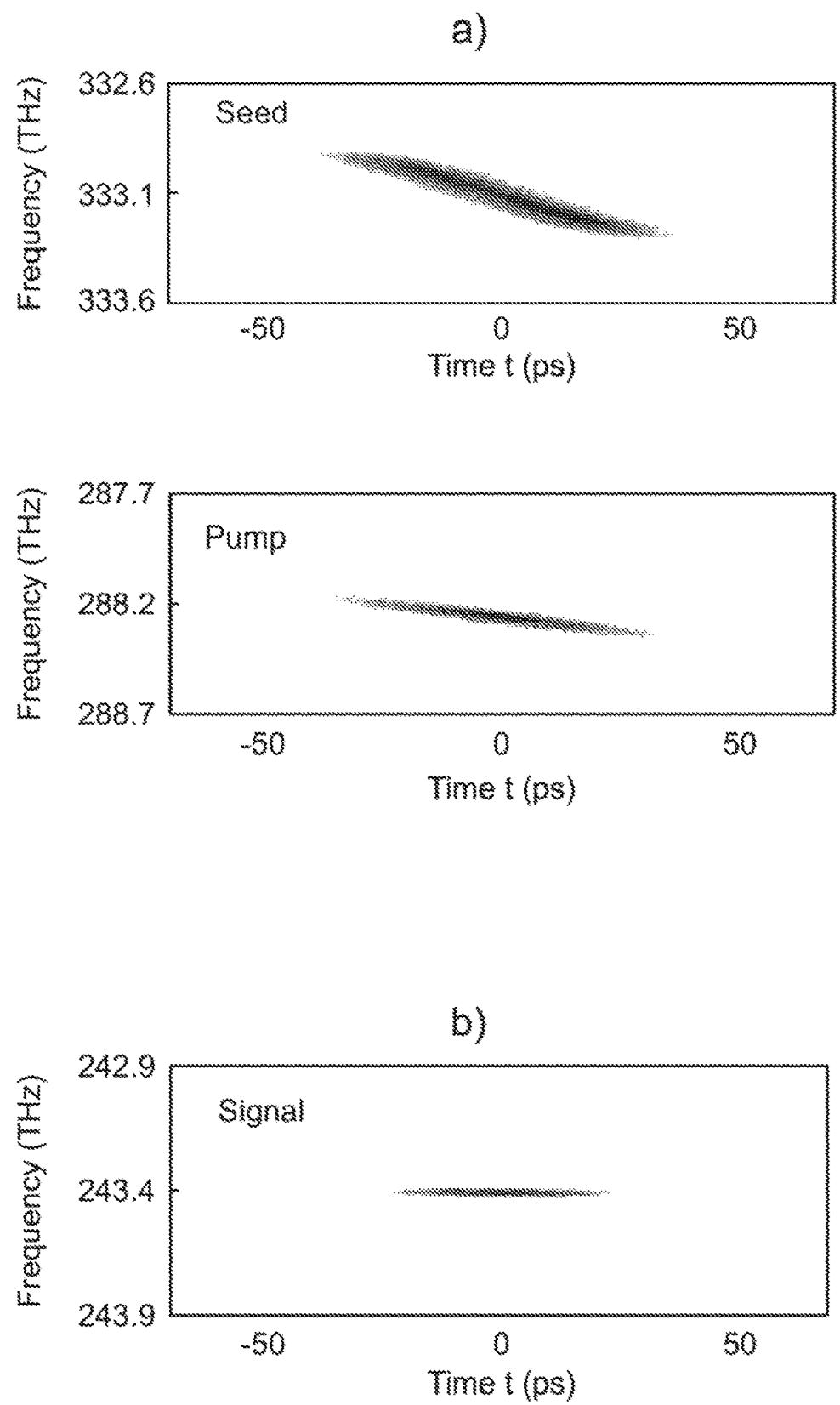

FIG. 1 is a sketch of a device for generating output laser pulses having a tunable central wavelength, based on parametric amplification according to one preferred exemplary embodiment of the disclosure, FIG. 2 is a schematic depiction of the concept of bandwidth control by influencing the spectral phase of the pump pulses on the dispersion of the FOPO, and, FIG. 3 provides Wigner charts of a seed pulse, a pump pulse, and the resultant output pulse.

Corresponding reference numerals indicate corresponding parts throughout the several views of the drawings.

DETAILED DESCRIPTION

Example embodiments will now be described more fully with reference to the accompanying drawings.

FIG. 1 is a sketch of a device for generating output laser pulses having a tunable central wavelength 1, based on parametric amplification. In the present exemplary embodiment, the laser pulses are generated by means of an electronically controllable optical pulse generator 3 at an adjustable repetition rate. In its simplest embodiment, the pulse generator 3 may be a gain switched laser diode. If better amplitude stability is required for the laser system, the use of additional optical "injection seeding" of the laser diode, or, alternatively, the use of a continuously emitting laser diode is provided. In a preferred embodiment, if a continuously emitting laser diode is used, the required pulses are generated by subsequent electronically controlled pulse formation using amplitude modulation based on an electrooptical modulator. The wavelength of the electronically controllable optical pulse generator 3 is selected appropriate for the used parametric amplification curve of the subsequent fiber-based optical parametric oscillator 2, in one exemplary embodiment by using GaAs-based laser diodes (depending on resonator design with an emission wavelength between 780-1330 nm).

For power scaling the pump radiation, in one embodiment it is provided that one to a plurality of optical amplifying stages 7 are used. The amplifying stages 7 are arranged in the optical path between pump pulse generated and fiber-based optical parametric oscillator 2. In the embodiment of the disclosure illustrated in FIG. 1, ytterbium glass fiber amplifiers are provided as amplifying stages 7. For controlling the spectral bandwidth of the wavelength-tunable emitted pulses of the laser system 1, the chirp and the spectral content of the pump pulses are adapted to the dispersive extension of the seed pulses in the parametric oscillator 2. The spectral phase is influenced using an optical device 4, the optical device 4 being realized independent from the specific embodiment in FIG. 1 in a fiber-coupled and thus adjustment-free design.

In one exemplary embodiment, the influencing may occur either upstream of, downstream of, or between the amplifying stages 7 or even with the pulse generation. When the influencing occurs downstream of pulse generation, in one embodiment this may occur due to the use of passive or active glass fibers in a linear or non-linear regime. In another exemplary embodiment, the spectral phase of the pump pulses may be influenced by the use of chirped fiber Bragg or long periodic gratings or by the use of active components (e.g. using an acoustooptical programmable dispersive filter).

In the subsequent fiber-integrated optical parametric oscillator 2, a pump pulse is converted to one wavelength-shifted idler pulse and one wavelength-shifted signal pulse by parametric generation. One of the two shifted pulses (idler or signal pulse) is fed back via a resonator, so that it then acts as a seed pulse for parametric amplification. Since the parametric amplification is an energy-conserving process, the non-resonant signal pulse or idler pulse is amplified at the same time and may be decoupled as output signal of the laser system. By using a dispersive element 5 in the resonator in combination with short pump pulses, a dispersive wavelength filter is realized and finely adjusted by the chirp of the pump pulses.

FIG. 1 illustrates, as dispersive element 5, a long glass fiber, which may be a monomode fiber in a preferred embodiment. Furthermore, the parametric amplification is illustrated in FIG. 1 in a fiber-integrated design by means of a photonic crystal fiber 6 (PCF). In another embodiment, the parametric amplification may also be accomplished by means of integrated parametric amplifying chips. The parametric amplification might have to be adjusted in order to realize particularly broad spectral tuning curves of the FOPO. To enable rapid switching, the amplification range must comprise the entire output wavelength range at all times, and may not first be adjusted to the desired output wavelength, for instance using temperature regulation.

Since the parametric amplification curve is determined primarily by the dispersion of the waveguide, a broad effective amplification spectrum may be attained by varying the fiber diameter. The wavelength dispersion in the amplifier is thus influenced along the dispersion direction of the light in that different wavelengths are amplified at different positions in the waveguide. The change in the fiber diameter along the length of the fiber may be realized by tapering the glass fiber using heat and tensile forces prior to installing it in the FOPO. In one special embodiment, the change in the diameter may be limited to two or more different but constant diameters or may mean a continuous change in the diameter along the fiber.

In the case of realizing the amplification using integrated optical chips, the dispersion of the amplifying chip may be adjusted by adapting the geometry of the light-conducting waveguide of the chip. In one special embodiment, this may also entail limitation to two or more different constant diameters or may mean a continuous change in the diameter. The amplification profile of the FOPO is thus dependent on the position in the amplifying medium, and an effectively broad amplification profile results when there is passage through all of the medium. For example, the amplification range of the idler pulses covered in the prior art in the past, 1100 nm-1300 nm, may be extended to an effective amplification range of 1100 nm-160 nm, which would permit, for example, use of the output pulses for coherent Raman spectroscopy for the so-called "CH segment range," as well.

FIG. 2 provides a schematic Wigner chart for the concept for forming the generated signal pulses. Illustration a) provides a schematic Wigner chart of the seed pulses extended by dispersion in the resonator. For non-influenced, e.g. bandwidth-limited pump pulses, the dispersive extension of the seed pulses merely effects the opportunity to select the wavelength of the signal pulses using the arrival time (provided by the repetition rate) of the pump pulses. Due to the energy conservation in the parametric amplification, the generated signal pulses have a chirp reversed to the seed pulses. At any time the resultant signal wavelength is provided by the frequency separation between pump pulse and seed pulse at this point in time. Illustration b) illustrates the possibility of controlling the bandwidth of the emitted signal pulses by influencing the phase (and where necessary also the amplitude) of the pump pulses. In this case, the exemplary depiction illustrates influencing the spectral phase of Gaussian pump pulses to half of the chirp parameter C of the seed pulses. Influencing the phase leads to bandwidth-limited, narrow-band signal pulses, e.g. for high resolution spectroscopy. Illustration c) illustrates an example of generating particularly broad-band signal pulses, e.g. for multiphoton microscopy. The pump pulses in this case are generated with a chirp that is negative relative to the seed pulses.

Illustration a) of FIG. 3 illustrates the result of a numeric simulation that permits precise insight into seed pulse and pump pulse in a Wigner chart upstream of the amplifying fiber. It may be seen that, in the illustrated preferred embodiment, the pump pulses follow a line having half the incline of the seed pulses. The chirp parameter used here for the pump pulses leads to generation of narrow-band output pulses. Illustration b) provides the resulting narrow-band output pulse after 30 simulated cycles in the fiber-based parametric oscillator.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are to be regarded as a departure from the disclosure, and all such modifications are intended to be included within the scope of the disclosure.

The invention claimed is:

1. A device for generating output laser pulses having a tunable central wavelength, based on parametric amplification, comprising:
    an optical pump pulse generator having an adjustable repetition rate for generating pump pulses,
    a fiber-based optical parametric oscillator having a feedback device and a parametric amplifying medium, embodied to receive the pump pulses and convert the latter using parametric generation to a wavelength-shifted idler pulse and a signal pulse wavelength-shifted thereto, and
    a dispersive feedback device designed to feed back the idler pulse or the signal pulse via a resonator, so that the idler pulse or the signal pulse then may be used as seed pulse for the parametric amplification,
    wherein,
    for adjustability of the bandwidth of the output laser pulses, an optical device is provided that is designed to influence the spectral phase of the pump pulses as a function of the phase of the seed pulses by adapting the spectral phase of the pump pulses to the spectral phase of the seed pulses.

2. The device according to claim 1, wherein the optical device is embodied to influence the spectral phase of the pump pulses following pulse generation.

3. The device according to claim 1, wherein the optical device is arranged in the optical path between the pump pulse generator and the fiber-based optical parametric oscillator for influencing the spectral phase of the pump pulses.

4. The device according to claim 1, wherein the optical device is embodied as a glass fiber for influencing the spectral phase of the pump pulses.

5. The device according to claim 1, wherein the optical device is embodied as a chirped fiber Bragg grating or long-periodic grating for influencing the spectral phase of the pump pulses.

6. The device according to claim 1, wherein the optical device is embodied as an active component for influencing the spectral phase of the pump pulses.

7. The device according to claim 1, wherein the device is embodied to influence the spectral phase of the pump pulses as early as during pulse generation.

8. The device according to claim 1, wherein the optical pump pulse generator is embodied as a gain switched laser diode.

9. The device according to claim 1, wherein the optical pump pulse generator is embodied as a continuously emitting laser diode and the pump pulses are formed by subsequent modulation using amplitude modulation by means of modulators.

10. The device according to claim 1, wherein at least one optical amplifying stage is provided in the optical path between pump pulse generator and fiber-based optical parametric oscillator.

11. The device according to claim 1, wherein the parametric amplifying medium has an amplifying bandwidth that corresponds at least to the entire tuning range without additional changes to parameters.

12. The device according to claim 11, wherein the amplifying bandwidth is embodied by a change in a waveguide dispersion of a parametric amplifying medium along the dispersion direction of the light using a change in waveguide geometry along the dispersion direction of the light.

13. The device according to claim 12, wherein the change in the waveguide geometry is accomplished using two or more different but constant cross-sections of the waveguide along the dispersion direction of the light, or in that the change in the waveguide geometry is accomplished using a continuous change in the cross-section along the dispersion direction of the light.

14. The device according to claim 1, wherein the optical device is designed to influence the spectral phase of the pump pulses to half of the chirp parameter C of the seed pulses generating narrow-band output signal pulses.

15. The device according to claim 1, wherein the optical device is designed to influence the spectral phase of the pump pulses with a chirp parameter C that is negative relative to the seed pulses generating broad-band output signal pulses.

16. A method for generating output laser pulses having a tunable central wavelength and an adjustable bandwidth, based on parametric amplification, comprising:
generating pump pulses having an adjustable repetition rate, receiving the pump pulses in a fiber-based optical parametric oscillator having a parametric amplifying medium,
converting the pump pulses using parametric generation to a wavelength-shifted idler pulse and a signal pulse wavelength-shifted thereto,
feeding back the idler pulse or the signal pulse via a dispersive resonator,
using the fed-back idler pulse or signal pulse then as a seed pulse for parametric amplification, and,
influencing the spectral phase of the pump pulses as a function of the phase of the seed pulses by means of an optical device by adapting the spectral phase of the pump pulses to the spectral phase of the seed pulses.

* * * * *